(12) United States Patent
Williamson et al.

(10) Patent No.: US 12,266,597 B2
(45) Date of Patent: Apr. 1, 2025

(54) MULTILEVEL PACKAGE SUBSTRATE WITH STAIR SHAPED SUBSTRATE TRACES

(71) Applicant: Texas Instruments Incorporated, Dallas, TX (US)

(72) Inventors: Jaimal Mallory Williamson, McKinney, TX (US); Chun Ping Lo, Allen, TX (US); Yutaka Suzuki, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 435 days.

(21) Appl. No.: 17/563,403

(22) Filed: Dec. 28, 2021

(65) Prior Publication Data

US 2023/0207435 A1      Jun. 29, 2023

(51) Int. Cl.
*H01L 23/498* (2006.01)
*H01L 21/48* (2006.01)
*H01L 23/00* (2006.01)

(52) U.S. Cl.
CPC .... *H01L 23/49822* (2013.01); *H01L 21/4857* (2013.01); *H01L 21/4853* (2013.01); *H01L 23/49816* (2013.01); *H01L 24/13* (2013.01); *H01L 24/16* (2013.01); *H01L 2224/13147* (2013.01); *H01L 2224/16225* (2013.01)

(58) Field of Classification Search
CPC ...... H05K 1/0271; H05K 1/0296–0298; H01L 23/49822–49844; H01L 23/498; H01L 21/4857; H01L 21/4853; H01L 23/49816; H01L 24/13; H01L 24/16; H01L 2224/16225; H01L 24/81; H01L 23/5283–5384; H01L 23/5386; H01L 23/49838–49844; H01L 23/49827
See application file for complete search history.

(56) References Cited

U.S. PATENT DOCUMENTS

| | | |
|---|---|---|
| 2014/0202740 A1 | 7/2014 | Maeda et al. |
| 2014/0293547 A1* | 10/2014 | Kung ..................... H05K 1/112 361/728 |
| 2014/0301058 A1 | 10/2014 | Sunohara et al. |
| 2019/0393143 A1* | 12/2019 | Rosch .................... H05K 1/115 |
| 2020/0006234 A1 | 1/2020 | Jeng et al. |
| 2021/0098351 A1 | 4/2021 | Chou et al. |

OTHER PUBLICATIONS

"Flip Chip Ball Grid Array Package Reference Guide", Texas Instruments, Literature No. SPRU811A, May 2005.
PCT International Search Report Application No. PCT/US2022/054139, mailed May 9, 2023, 3 pgs.

* cited by examiner

*Primary Examiner* — Evan G Clinton
(74) *Attorney, Agent, or Firm* — Xiaotun Qiu; Frank D. Cimino

(57) ABSTRACT

An electronic device includes a multilevel package substrate with first and second levels, the second level including a first trace layer with a first conductive trace feature, a conductive first via that contacts the first conductive trace feature, and a first dielectric layer, and the first level including a second trace layer with a stair shaped second conductive trace feature, the second conductive trace feature having a first portion with a first thickness, and a second portion, having a second thickness greater than the first thickness.

20 Claims, 15 Drawing Sheets

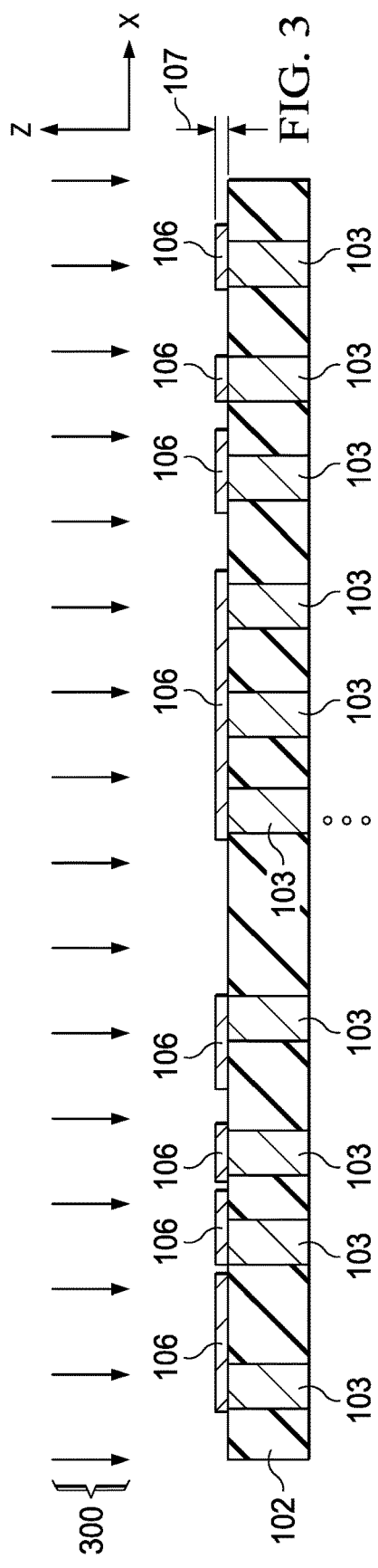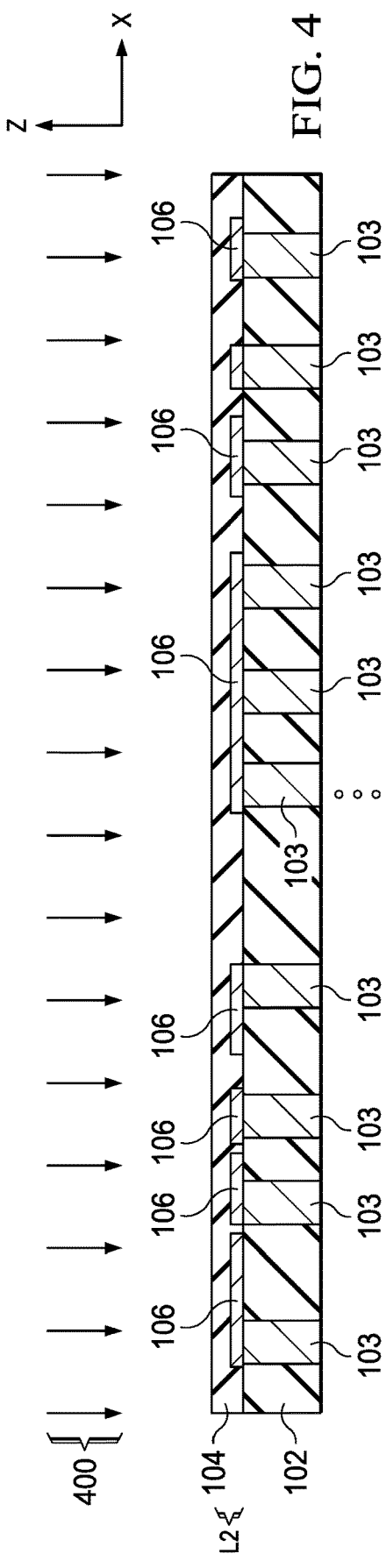

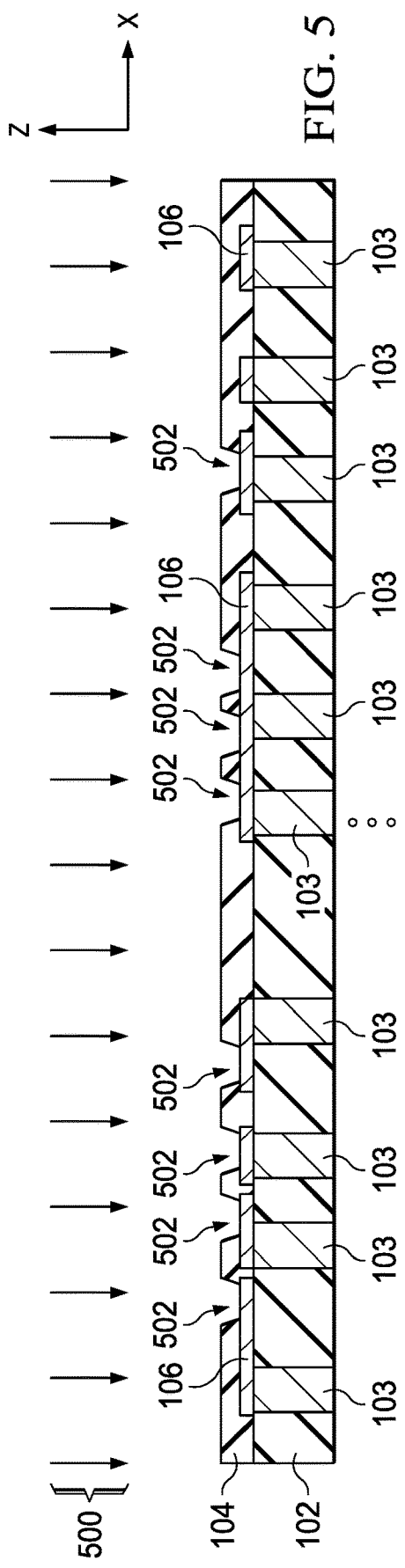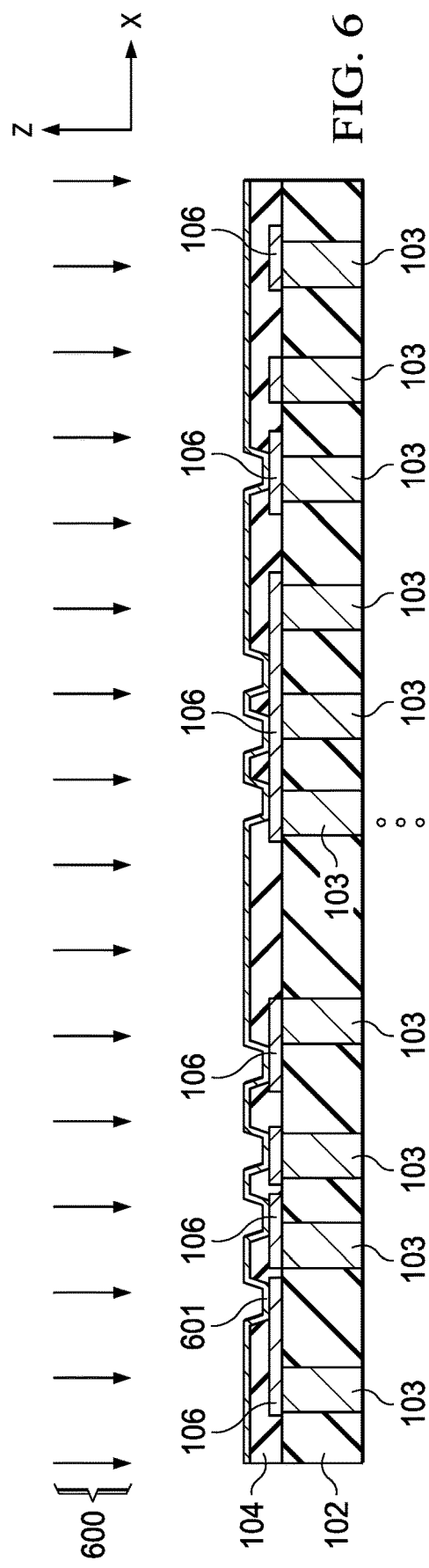

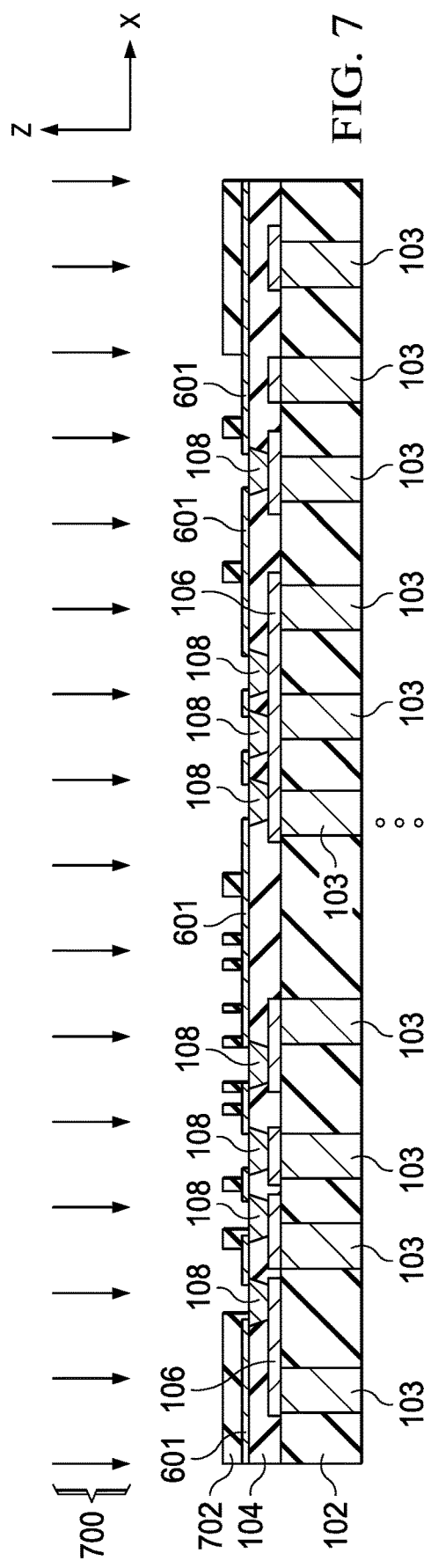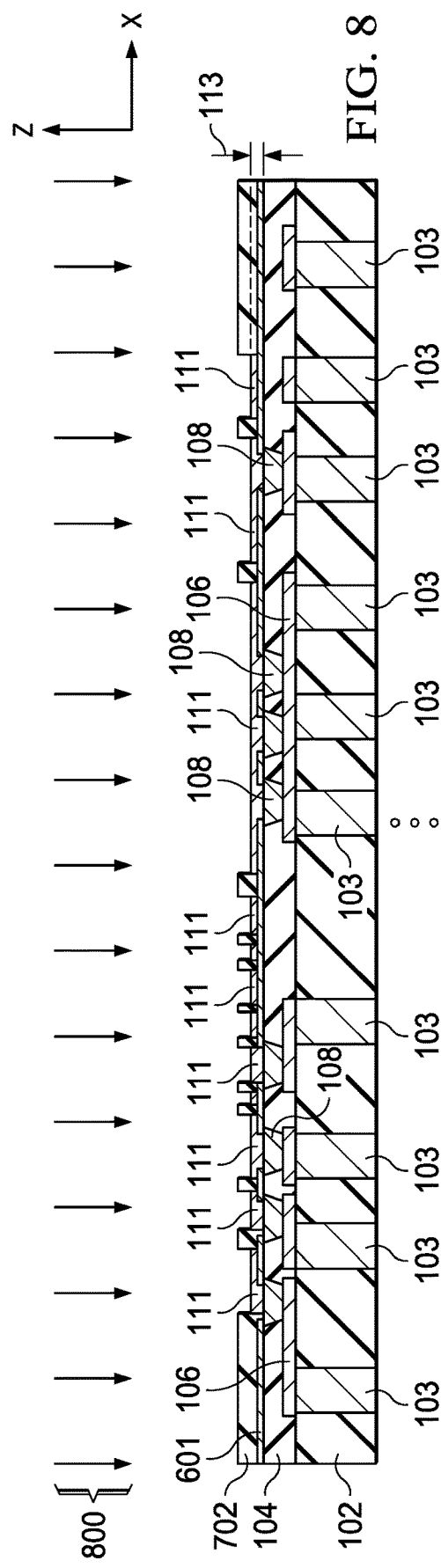

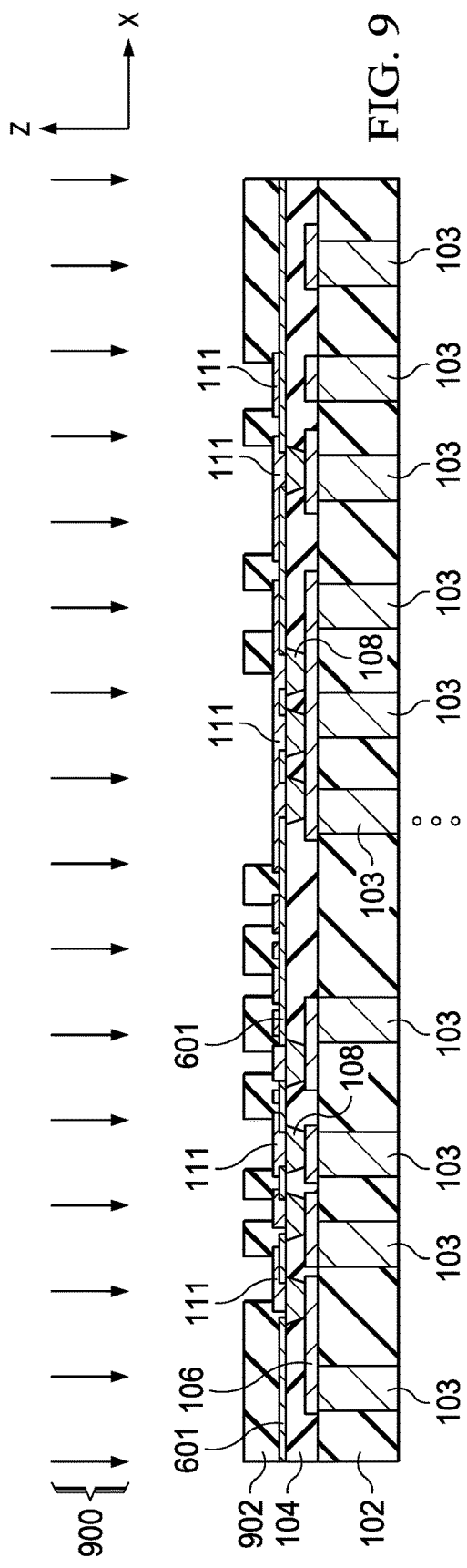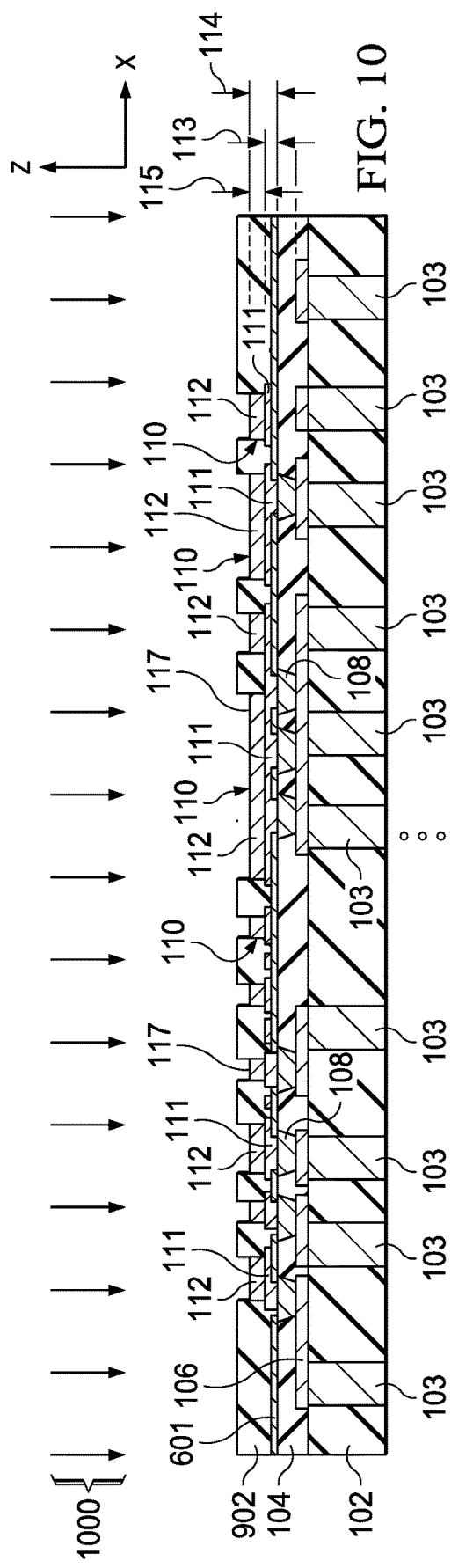

MULTILEVEL PACKAGE SUBSTRATE WITH STAIR SHAPED SUBSTRATE TRACES

BACKGROUND

Increased functionality in packaged electronic devices has led to miniaturization of packages to accommodate increased trace and die landing area density, with substrate lines and space continuing to shrink. Reduced cross-sectional area, however, can make substrate traces more vulnerable to reliability issues during stress or field exposure, for example, in automotive or industrial applications. Substrate trace cracks can occur in one or more substrate layers of a package substrate, for example, through package deflection at or near an edge or side of a semiconductor die edge caused by mechanical coupling of components with different coefficients or thermal expansion (CTE) during temperature cycling.

SUMMARY

In one aspect, an electronic device includes a multilevel package substrate and a die, where the multilevel package substrate has first and second levels. The second level includes a first trace layer with a first conductive trace feature, a conductive first via that contacts the first conductive trace feature, and a first dielectric layer. The second level includes a second trace layer with a second conductive trace feature having first and second portions. The first portion has a first thickness, and the second portion has a side and a second thickness, where the second thickness is greater than the first thickness.

In another aspect, a multilevel package substrate has first and second levels. The second level includes a first trace layer with a first conductive trace feature, a conductive first via that contacts the first conductive trace feature, and a first dielectric layer. The second level includes a second trace layer with a second conductive trace feature having first and second portions. The first portion has a first thickness, and the second portion has a side and a second thickness, where the second thickness is greater than the first thickness.

In a further aspect, a method includes forming a second level on a side of a core dielectric layer in a first plane of orthogonal first and second directions, where the second level includes a first trace layer with a first conductive trace feature, a conductive first via that contacts the first conductive trace feature, and a first dielectric layer. The method also includes forming a second level that extends on the second level in a second plane of the first and second directions. The second level includes a second trace layer with a second conductive trace feature that has a first portion and a second portion. The first portion has a first thickness along an orthogonal third direction and the second portion has a side and a second thickness along the third direction, where the side of the second portion faces away from the first plane, and the second thickness is greater than the first thickness.

BRIEF DESCRIPTION OF THE DRAWINGS

FIGS. 3-14 are partial sectional side elevation views of the packaged electronic device of FIGS. 1-1D undergoing fabrication according to the method of FIG. 2.

DETAILED DESCRIPTION

Figure 1:
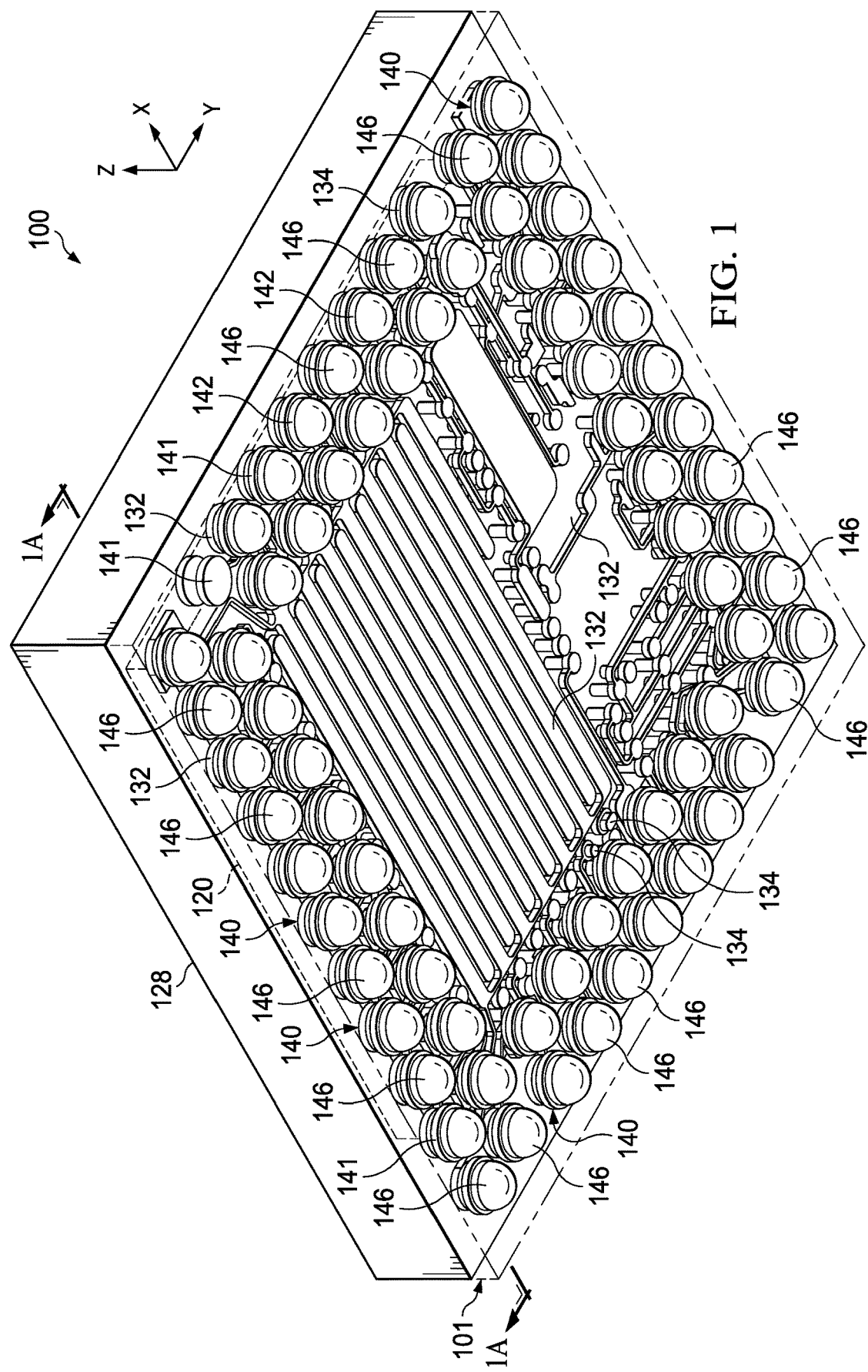
FIG. 1 is a perspective view of a flip chip ball grid array packaged electronic device with stair shaped substrate traces.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
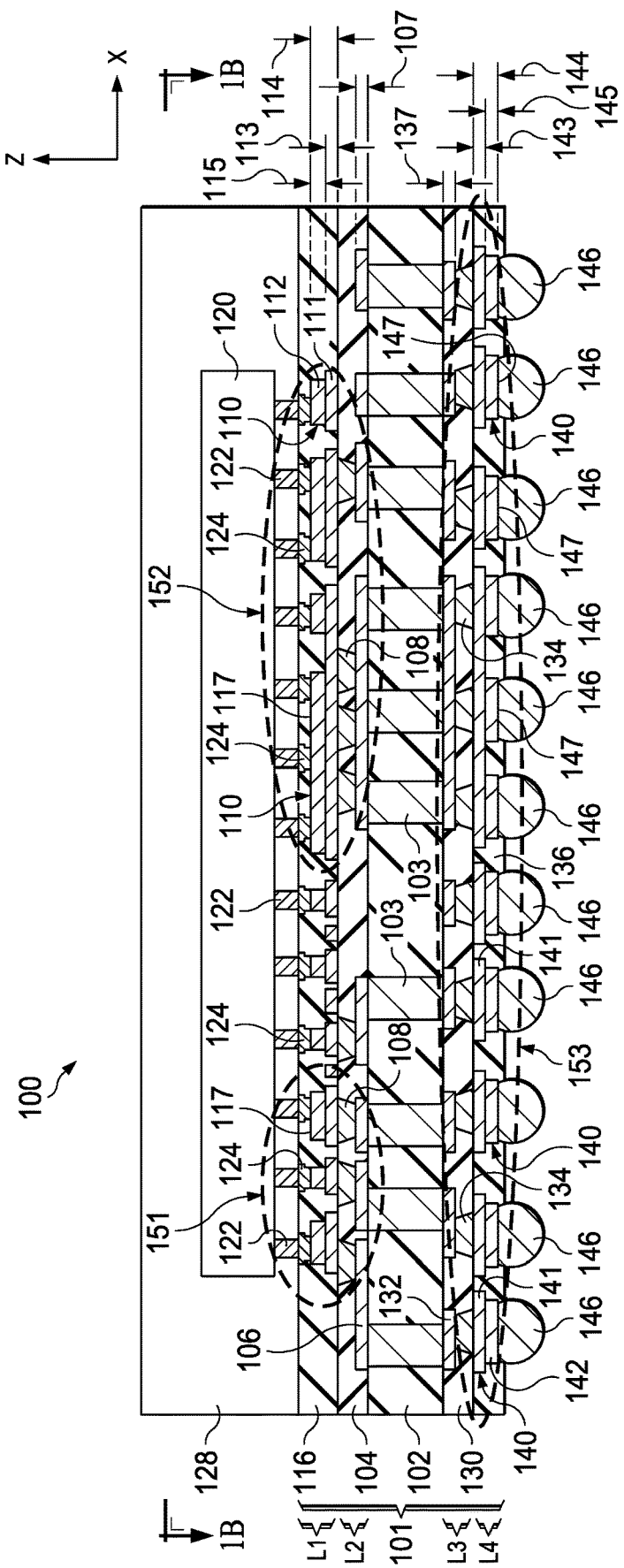
FIG. 1A is a partial sectional side elevation view of the electronic device taken along line 1A-1A of FIG. 1.
Figure 1B:
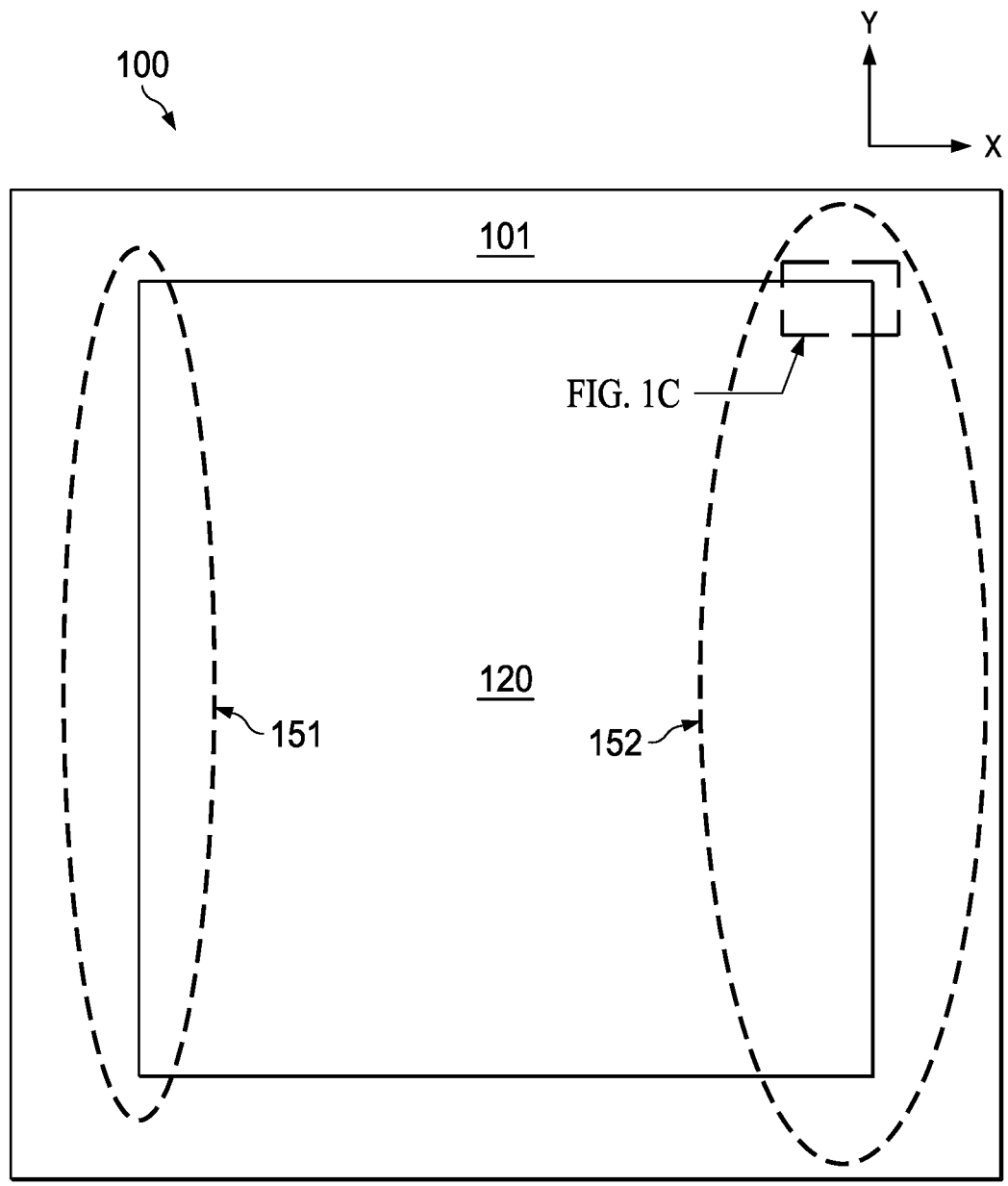
FIG. 1B is a partial sectional top view of the electronic device 100 taken along line 1B-1B of FIG. 1A.
Figure 1C:
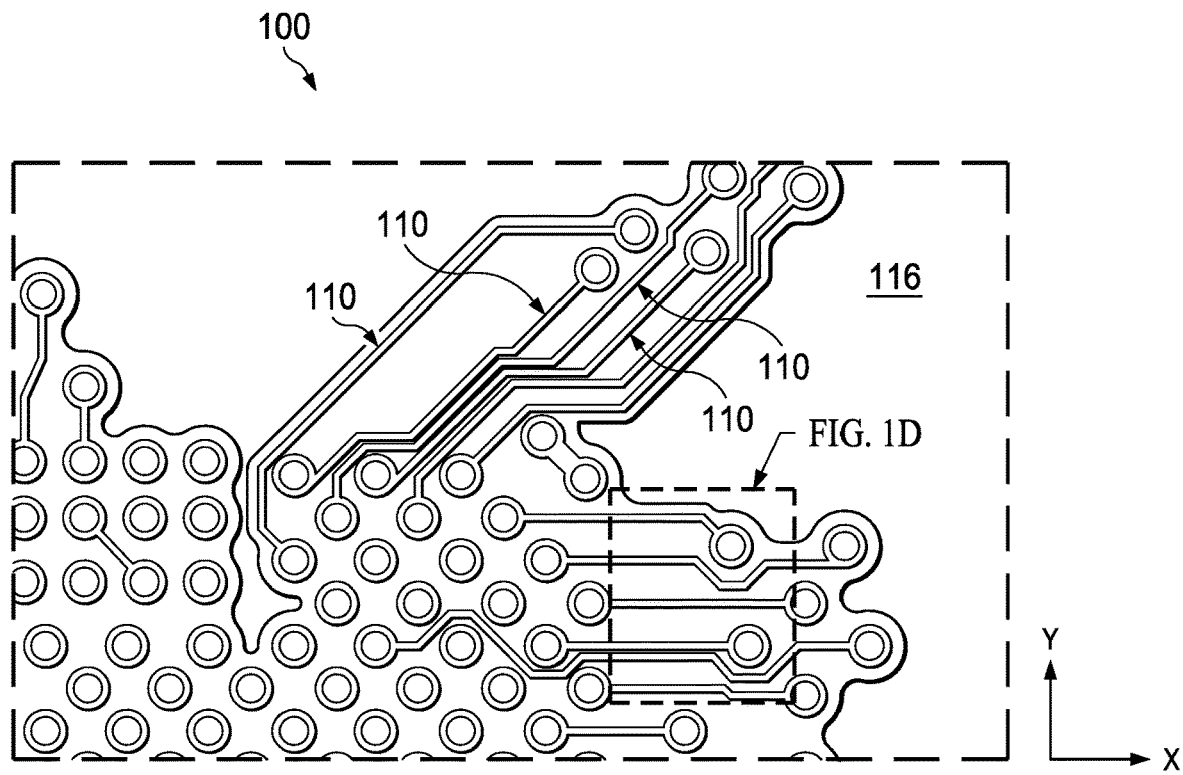
FIG. 1C is a partial top view of a portion of a multilevel package substrate of the electronic device.
Figure 1D:
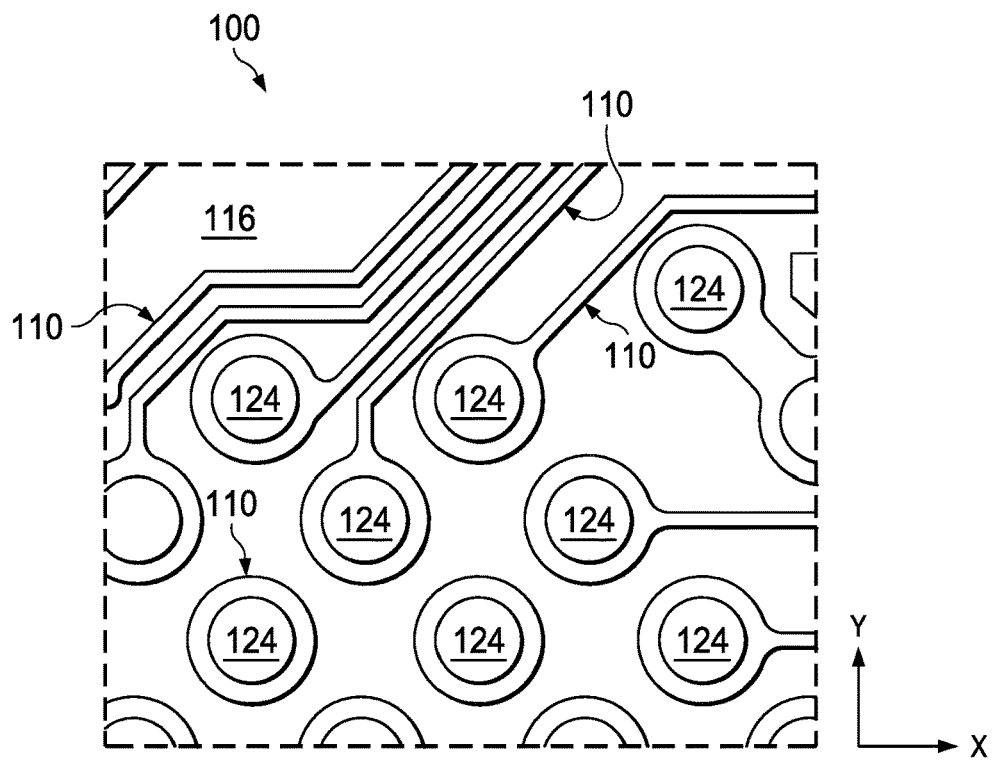
FIG. 1D is a partial top view of traces and die landing areas in a portion of the multilevel package substrate of the electronic device.

Referring initially to FIGS. 1-1D, FIG. 1 shows a perspective bottom view of a flip chip ball grid array (FCBGA) packaged electronic device 100 that includes a multilevel package substrate 101. FIG. 1A shows a partial sectional side view of the electronic device 100 taken along line 1A-1A in FIG. 1. FIG. 1B shows a partial sectional top view of the electronic device 100 along line 1B-1B of FIG. 1A, FIG. 1C shows a partial top view of a portion of the multilevel package substrate 101, and FIG. 1D shows a partial top view of traces and die landing areas in a portion of the multilevel package substrate 101.

The multilevel package substrate 101 includes four levels L1, L2, L3, and L4. In other examples, the multilevel package substrate includes any integer number of two or more levels. The individual levels L1-L4 have patterned conductive features, such as copper, aluminum, or other conductive metal. A core dielectric layer 102 has opposite first and second sides. The first and second levels L1 and L2 are formed on or above the first side of the core dielectric layer 102 (e.g., the upper or top side in the orientation shown in FIGS. 1 and 1A), and third and fourth levels L3 and L4 are formed on or below a second (e.g., lower or bottom) side of the core dielectric layer 102. The second level L2 extends on the top side of the core dielectric layer 102 in a second plane of orthogonal first and second directions X and Y, respectively. The core dielectric layer 102 and the levels L1-L4 are formed in a stack structure along a third direction Z that is orthogonal to the first and second directions X and Y. The first level L1 extends on the second level L2 in a second plane of the first and second directions X and Y. The third level L3 extends on the bottom side of the core dielectric layer 102 in a third plane of the first and second directions X and Y. The fourth level L4 extends on the third level L3 in a fourth plane of the first and second directions X and Y.

As best shown in FIG. 1A, the core dielectric layer 102 includes conductive plated through holes 103 (e.g., copper, aluminum or other conductive metal) that extend through the core dielectric layer 102 along a third direction Z that is orthogonal to the first and second directions X and Y. The second level L2 includes a first dielectric layer 104 and a first trace layer with a first conductive trace features 106 on the top side of the core dielectric layer 102. The first conductive features 106 have a thickness 107, for example, 10-25 um. The second level L2 also includes conductive first vias 108 that contact respective ones of the first conductive trace features 106. The first dielectric layer 104 in one example is a compression molded laminate layer that extends between and around different conductive features of the second level L2 and between adjacent levels in the multilevel package substrate 101. The molded dielectric features in the various levels in one example are or include an electrically insulating dielectric material, for example, a film like the Ajinomoto build-up film (ABF) or a glass-fiber reinforced prepreg material. The thickness and dielectric material in the respective levels provide a withstanding voltage according to a desired voltage separation between circuits and components thereof for a given design.

The first level L1 includes a second trace layer with second conductive trace features 110 on the second level L2. One or more of the respective second conductive trace features 110 have a stair shape with a first portion 111 and a thicker second portion 112. The first portions 111 have a first thickness 113 along the third direction Z. The respective second portions 112 have a side 117 that faces away from the first plane (e.g., a top side that faces upward in the illustrated orientation of FIG. 1A). The respective second portions 112 have a second thickness 114 along the third direction Z. The second thickness 114 is greater than the first thickness 113 and the top sides of the second portions 112 extend above the tops of the first portions 111 by a distance 115, for example, 1-15 um. In one example, the first thickness 113 is 10 to 20 um (e.g., 15 um+/−5 um), and the second thickness 114 is 5 to 15 um greater than the first thickness 113 (e.g., the extra thickness distance 115 is 10 um+/−5 um). The stair shaped second conductive trace features 110 in one example are formed in select high stress areas or regions to mitigate or avoid trace cracking as illustrated and described further below in connection with FIGS. 1B-1D.

The electronic device 100 includes an upper solder mask structure 116 with openings above portions of the top sides 117 of the second portions 112 of the second conductive trace features 110 for solder connections to conductive terminals of a semiconductor die 120. The solder connection is a flip-chip solder connection of conductive terminals 122 (e.g., copper posts or bumps) of the die 120 using conductive solder 124 to electrically couple the respective terminals 122 to top sides 117 of the respective second portions 112. The electronic device 100 also includes a package structure 128 that encloses the die 120 and a portion of the multilevel package substrate 101. In one example, the package structure 128 is or includes a molded material, such as plastic. In another example, the package structure 128 is or includes a ceramic material.

The third level L3 includes a third dielectric layer 130, a third trace layer with one or more third conductive trace features 132 on the second (e.g., bottom) side of the core dielectric layer 102, and conductive second vias 134 that contacts the third conductive trace feature 132. The multi-level package substrate 101 in one example includes an optional second (e.g., bottom) solder mask 136 in the fourth level L4 that covers portions of a bottom side of the third dielectric layer 130. The third conductive features 132 have a thickness 137, for example, 10-25 um. The third dielectric layer 130 in one example is a compression molded laminate layer that extends between and around different conductive features of the third level L3 and between adjacent levels in the multilevel package substrate 101. In one example, the molded dielectric layers 104 and 130 of the multilevel package substrate 101 are or include MJ1 ABF RLF dielectric material, and the package structure 128 is or includes an epoxy mold compound (EMC).

The fourth level L4 includes a fourth trace layer with one or more fourth conductive trace features 140. One or more of the fourth conductive trace features 140 have a first portion 141 and a second portion 142. The first portions 141 of the fourth conductive trace features 140 have a third thickness 143 along the third direction Z, and the second portions 142 of the fourth conductive trace features 140 have a fourth thickness 144 along the third direction Z. The respective second portions 142 of the fourth conductive trace features 140 have second sides 147 that face away from the third plane (e.g., downward in the orientation of FIG. 1A). The fourth thickness 144 is greater than the third thickness 143 of the respective fourth conductive trace features 140. The multilevel package substrate 101 has one or more solder balls 146 attached to respective second sides 147 (e.g., landing pads) of the fourth conductive trace features 140 and allow soldering of the electronic device 100 to a host system such as a printed circuit board (PCB, not shown).

The fourth thickness 144 is greater than the third thickness 143 and the top sides of the second portions 142 extend above the tops of the first portions 141 by a distance 145, for example, 1-15 um. In one example, the third thickness 143 is 10 to 20 um (e.g., 15 um+/−5 um), and the fourth thickness 144 is 5 to 15 um greater than the third thickness 143 (e.g., the extra thickness distance 145 is 10 um+/−5 um). The stair shaped fourth conductive trace features 140 in one example are formed in select high stress areas or regions to mitigate or avoid trace cracking as illustrated and described further below in connection with FIGS. 1B-1D.

In certain implementations, the packaged electronic device 100 can include an optional conductive lid structure (e.g., FIGS. 15 and 16 below), such copper or other thermally and electrically conductive metal, for thermal dissipation during operation. The optional lid, where used, can extend above and optionally touch, the top side of the die 120, for example through an adhesive thermal interface material.

In one example, as shown in FIGS. 1A and 1B, one or more regions 151, 152, and 153 of the electronic device may be subject to mechanical stresses, for example, caused by thermal cycling during operation. Substrate traces can be susceptible to cracking at high stress areas like the die shadow region of a FCBGA package (as illustrated below) due to package deflection at die edge stemming from lid-to-substrate coupling during temperature cycling. This can be caused by mismatches in coefficient of thermal expansion (CTE) of adjacent structures, such as the die 120, the multilevel package substrate 101, any included lid, and the package structure 128.

FIGS. 1A and 1B show example first regions 151 and 152 having high thermally induced stress on conductive substrate traces in or near the die shadow region proximate a lateral side of the die 120. In one implementation, the second conductive features 110 are provided with the stair shapes having the first and second portions 111 and 112 in one or both of the first regions 151 and/or 152 of the first level L1 proximate a lateral side of the die 120. Different device designs can selectively include stair shaped second conductive features 110 within any identified or selected area so as to mitigate or avoid trace cracking. FIG. 1A further shows a second region 153 of the fourth level L4 having high susceptibility to stress and substrate trace cracking, and the illustrated example includes stair shaped fourth conductive trace features 140 having the first and second portions 141 and 142 positioned in the second region 153 of the fourth level L4 to mitigate or avoid trace cracking in the multilevel package substrate 101.

The described examples provide a solution to mitigate or avoid substrate trace cracking by the selective design of thicker portions 112 and/or 142 of copper or other trace metal within the same trace layer, for example, at high stress regions of the packaged electronic device 100. In other examples, one or more trace layers in the multilevel package substrate 101 have stair shaped conductive features with three or more thicknesses, selectively located to mitigate stress during device operation. These solutions allow a given design to be tailored for identified or suspected CTE mismatch structural relationships, for instance, proximate or along the die shadow region and adjacent area along the die corners and periphery where substrate traces have proven to crack due to higher trace density at these locations. As discussed below, the stair shaped conductive trace features can be fabricated using existing lithography processes employed in the substrate manufacturing to selectively heighten or thicken the cross-sectional area of the conductive trace by increasing the Z direction height to maximize crack propagation path. In this example, thicker (e.g., taller) copper thickness is strategically located at high stress areas within the package to mitigate stress and enable more robust chip-to-package interaction. A further benefit is that selectively increased substrate trace conductor thickness displaces an area where a higher CTE organic ABF dielectric would otherwise be located (e.g., displaces areas of the dielectric layer or of the solder mask), which improves the localized CTE mismatch based on higher volume of copper employed to extend margin.

FIG. 1B shows a top view of the device 100 having the die 120 flip-chip soldered to the respective landing areas or sides 117 of the multilevel package substrate 101 and indicates two example first regions 151 and 152 in which the second level includes one or more second conductive trace features 110 having a stair shape with the first portion 111 and the thicker second portion 112. FIG. 1C illustrates a portion of the top side of the multilevel package substrate 101 of FIG. 1B within the region 152. This portion includes several example traces 110 having the stair shape with the first and second portions 111 and 112 and illustrates a high trace density and landing area density in the first region 152. FIG. 1D shows further details of a portion of the region of FIG. 1C to further illustrate the tight spacing between routed trace features and the landing area sides of the second portions 112 under the solder 124.

As shown in FIG. 1, the landing pads formed by the second sides 147 have circular shapes and include patterned conductive features of the fourth level L4 to facilitate attachment of the solder balls 146 thereto. The electronic device 100 provides compatibility for existing PCB layouts design for FCBGA devices in combination with performance advantages associated with the multilevel package substrate 101. This facilitates improved electronic device performance without necessitating redesign of existing PCBs.

Referring also to FIGS. 2-14, FIG. 2 shows a method 200 of fabricating an electronic device and FIGS. 3-14 show the packaged electronic device 100 undergoing fabrication according to the method 200. The method 200 is described by way of example with layers built on both sides of a starting core layer. In various implementations, the layers can be concurrently built on the bottom and top, or one side (e.g., top or bottom) can be built first, followed by fabrication of one or more layers on the other side. The method 200 includes forming the second level L2 at 201-204 on the top side of the core dielectric layer 102, and forming the first level L1 on the second level L2. FIGS. 3-6 show formation of the second level L2, which is formed in one example concurrently with the third level L3, the details of which are not shown in FIGS. 3-10. At 201 in FIG. 2, the conductive plated through holes 103 are formed through the core dielectric layer 102 as shown in FIG. 3. The second level formation starts at 202 in FIG. 2 with forming patterned trace layers on both sides of the core dielectric layer 102 including forming the first conductive trace features 106 of the first trace layer on the top side of the core dielectric layer 102 to the thickness 107 (e.g., 10-25 um), and the patterned third trace layer of the third level is concurrently formed on the bottom side of the core dielectric layer 102. FIG. 3 shows one example, in which an electroplating processing 300 is performed using a patterned plating mask (not shown). In another example, the second level L2 can be formed by blanket deposition and etching steps. At 203, a first laminate dielectric layer is formed over the patterned first trace layer (and the third dielectric layer is formed on the bottom side (not shown in FIG. 4). FIG. 4 shows one example, in which a deposition process 400 is performed that forms the first dielectric layer 104 over the first conductive trace features 106 and the core dielectric layer 102. In one example, the process 400 is a compression molding operation that forms a compression molded laminate dielectric layer 104 that extends between and around different conductive trace features 106 of the second level L2 and forms a top side of the second level L2.

The vias 108 of the second level L2 are formed at 204 and 205. At 204, via openings or holes are formed through upper portions of the dielectric layer 104, for example, using a laser drilling process 500 in FIG. 5 that forms via openings 502 in the top side of the first dielectric layer 104 to expose portions of select ones of the first conductive trace features 106 of the first trace layer. At 205, the conductive vias 108 are formed in the openings 502, for example using a deposition process 600 shown in FIG. 6 that forms a seed layer (e.g., copper) 601 on the upper and lower dielectric layers and in the bottom and sidewalls of the via openings 502. The via processing can include a blanket deposition that fills the openings 502 and a planarization step (not shown). In another example, a masked electroplating operation is performed to form the conductive vias 108, followed by mask removal and a compression molding process. In one example, the compression molding process forms molded dielectric features 104 on exposed portions of the conductive trace features 106 of the first trace layer and the vias 108 of the second level L2 to an initial thickness that covers the first trace layer and the first via layer, followed by a grinding process that grinds upper portions of the molded dielectric material 104 and exposes the upper portions of the vias 108. In another example, a chemical etch is used. In a further example, a chemical mechanical polishing process is used.

Figure 2:
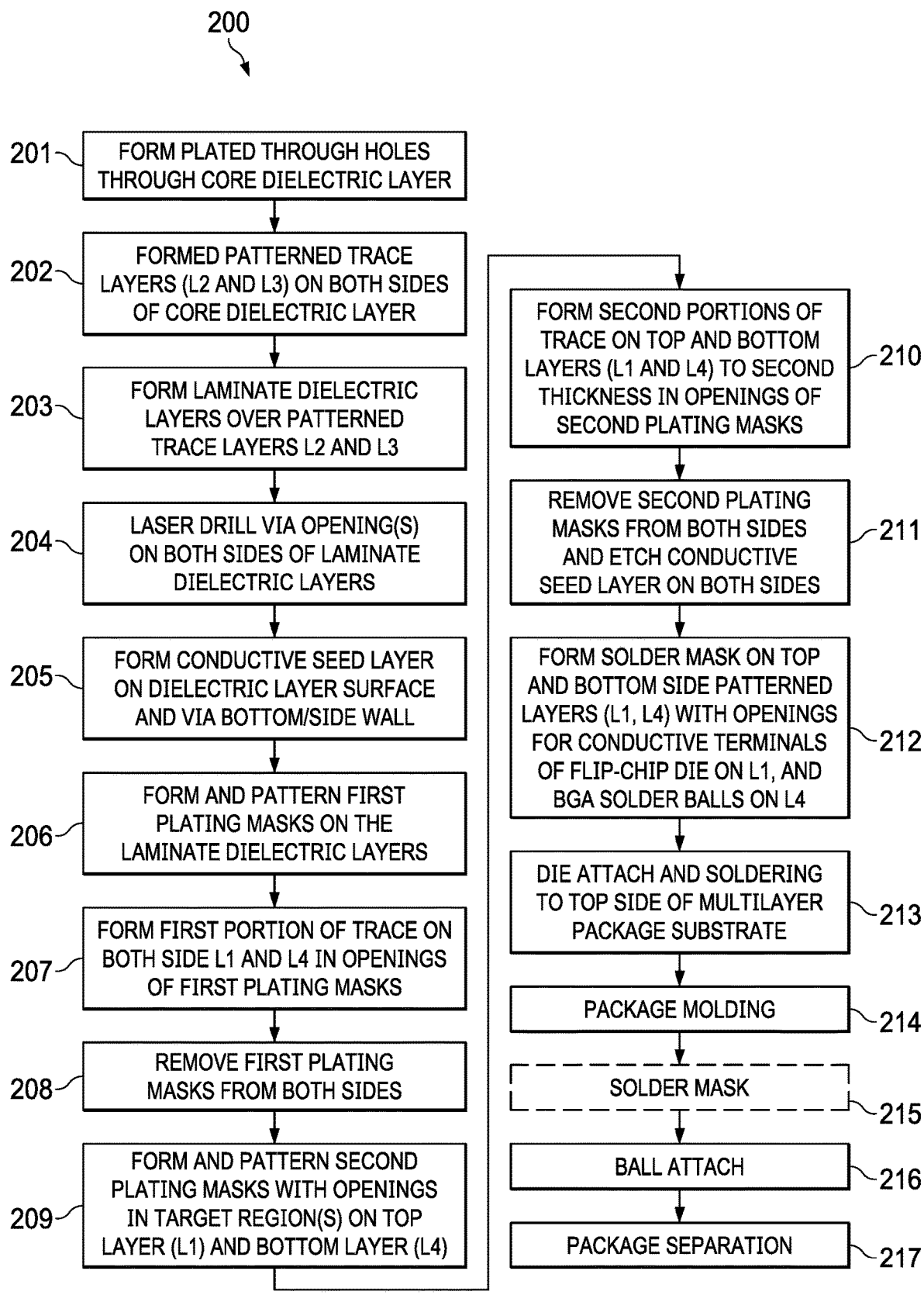
FIG. 2 shows a flow diagram of a method of fabricating an electronic device.

Referring also to FIGS. 7-11, the first level L1 is formed at 206-211 in FIG. 2. At 206, a first plating mask is formed and patterned on the first laminate dielectric layer 104 and the seed layer 601. FIG. 7 shows one example, in which a process 700 is performed that forms and patterns a first mask 702 on the second level L2. The first mask 702 exposes a first portion of the seed layer 601 on the second level L2 in which the first portions 111 of the second conductive features 110 are to be formed. At 207, the first portions 111 of the second conductive trace features 110 are formed to the first thickness in the openings of the first plating mask 702. FIG. 8 shows one example, in which an electroplating process 800 is performed that forms the first portions 111 of the second conductive trace features 110 (e.g., copper) to the first thickness (113) on the exposed first portion of the seed layer 601 of the second level L2 in the openings of the first plating mask 702. The first plating mask 702 is then removed at 208 in FIG. 2.

Figure 11:
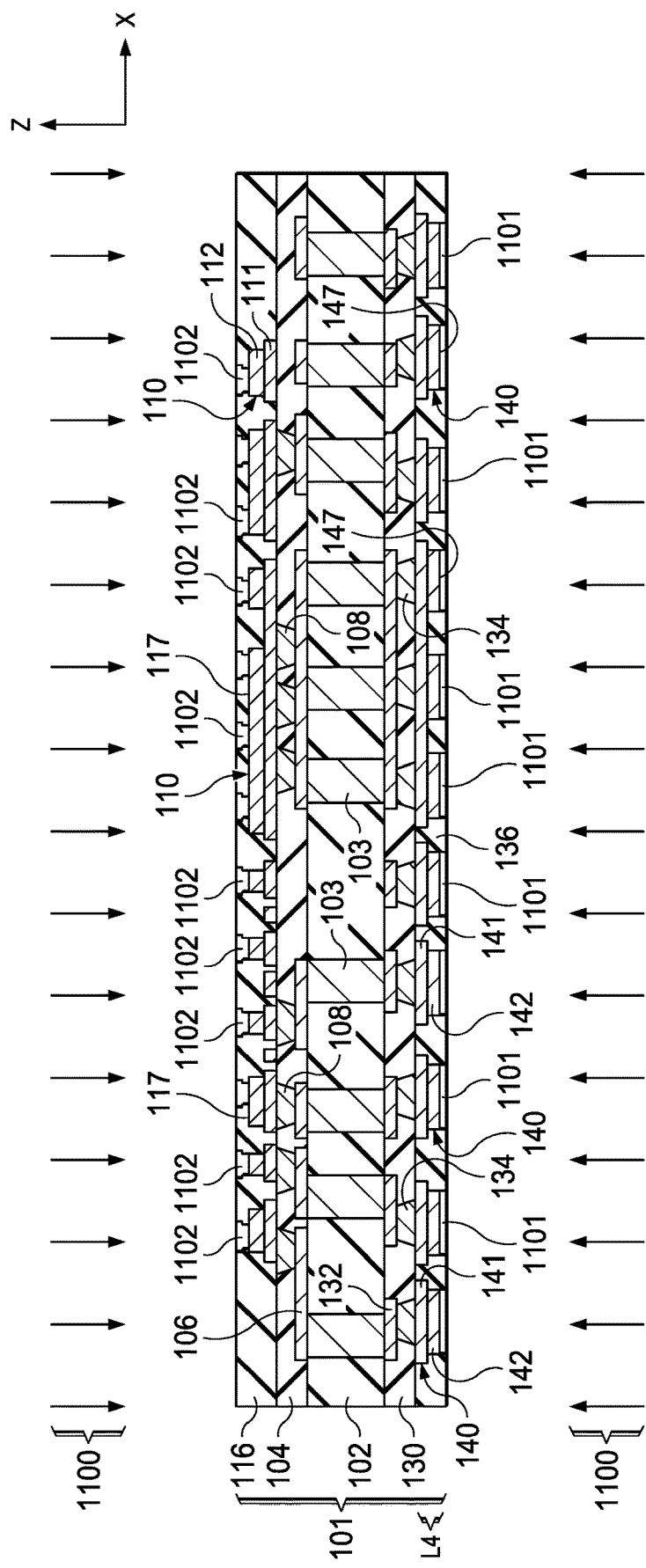

At 209, a second plating mask is formed and patterned on the first laminate dielectric layer 104 of the second level L2 and on part of the first portion 111 of the second conductive trace feature 110, and also on the bottom side, not shown. FIG. 9 shows one example, in which a process 900 is performed that forms and patterns a second mask 902 on the second level L2 and part of the first portion 111 of the second conductive trace feature 110. The second mask 902 exposes a second part of the first portion 111 of the second conductive trace feature 110 in which the second portions 112 are to be formed. At 210, the second portions 112 of the second conductive trace features 110 are formed on the exposed second parts of the first portions 111 using the second mask 902. FIG. 10 shows one example, in which an electroplating process 1000 is performed that forms the second portions 112 of the second conductive trace features 110 on the exposed second parts of the first portions 111 of the second conductive trace features 110 using the second mask 902. The second plating mask 902 is then removed and the remaining seed layer is etched at 211. In one example, the top and bottom side solder masks 116 and 136 are formed at 212. FIG. 11 shows one example, in which a deposition process 1100 is performed that forms the solder mask structure 116 with openings 1102 above portions of the top sides 117 of the second portions 112 of the second conductive trace features 110, and the process 1100 concurrently forms the bottom side solder mask 136 with openings 1101. In one example, the deposition process 1100 is a printing process.

Figure 12:
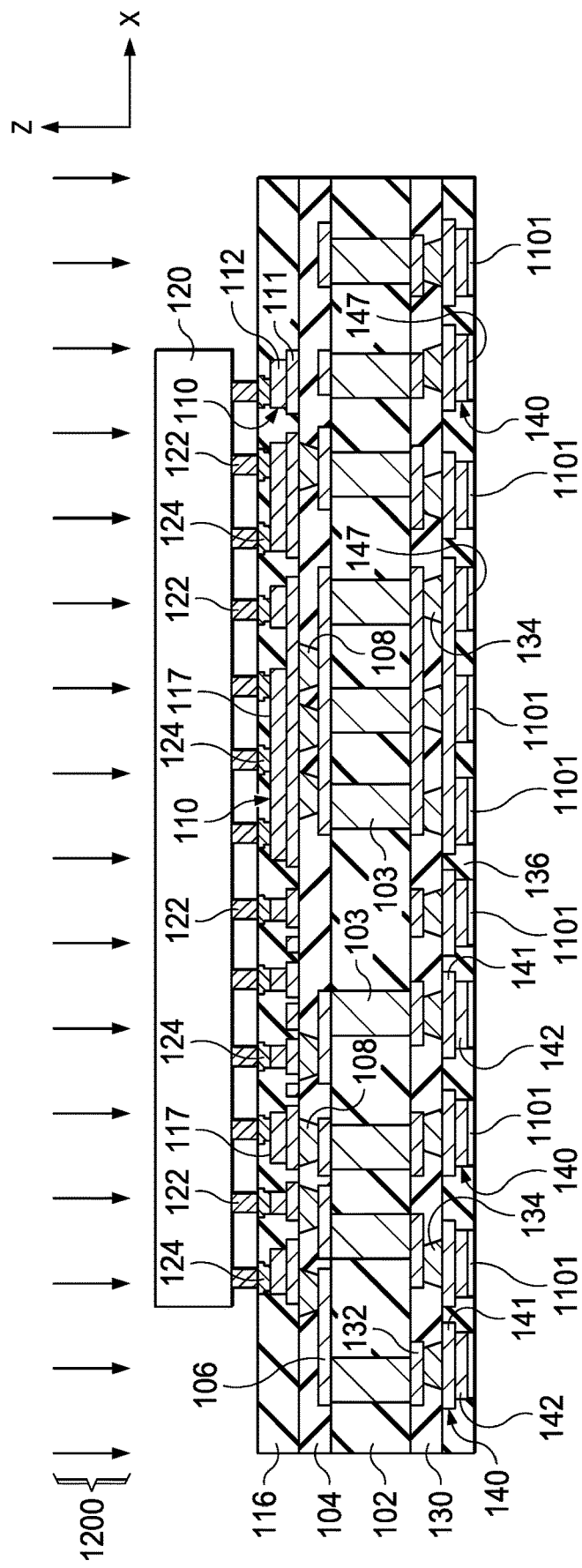

The method 200 continues at 213 in FIG. 2 with die attach and soldering or other electrical connection process to electrically couple the terminals 122 of the semiconductor die 120 to the top sides of the second portions 112 of the second conductive trace features 110. FIG. 12 shows one example, in which a flip-chip die attach and soldering electrical connection process 1200 is performed that electrically couples the conductive terminals 122 of the die 120 to the top sides of the second portions 112 of the respective second conductive trace features 110 using solder 124. The illustrated electrical connection example includes flip-chip soldering, in which solder is applied (e.g., dipped or otherwise deposited) onto the bottom sides of the conductive terminals 122 of the semiconductor die 120, and the semiconductor die 120 is placed with the respective terminals 122 on or over the respective landing areas on the top sides of the second portions 112 of the second conductive trace features 110. A thermal solder reflow process is performed that solders the die terminals 122 to the landing areas 101.

Figure 13:
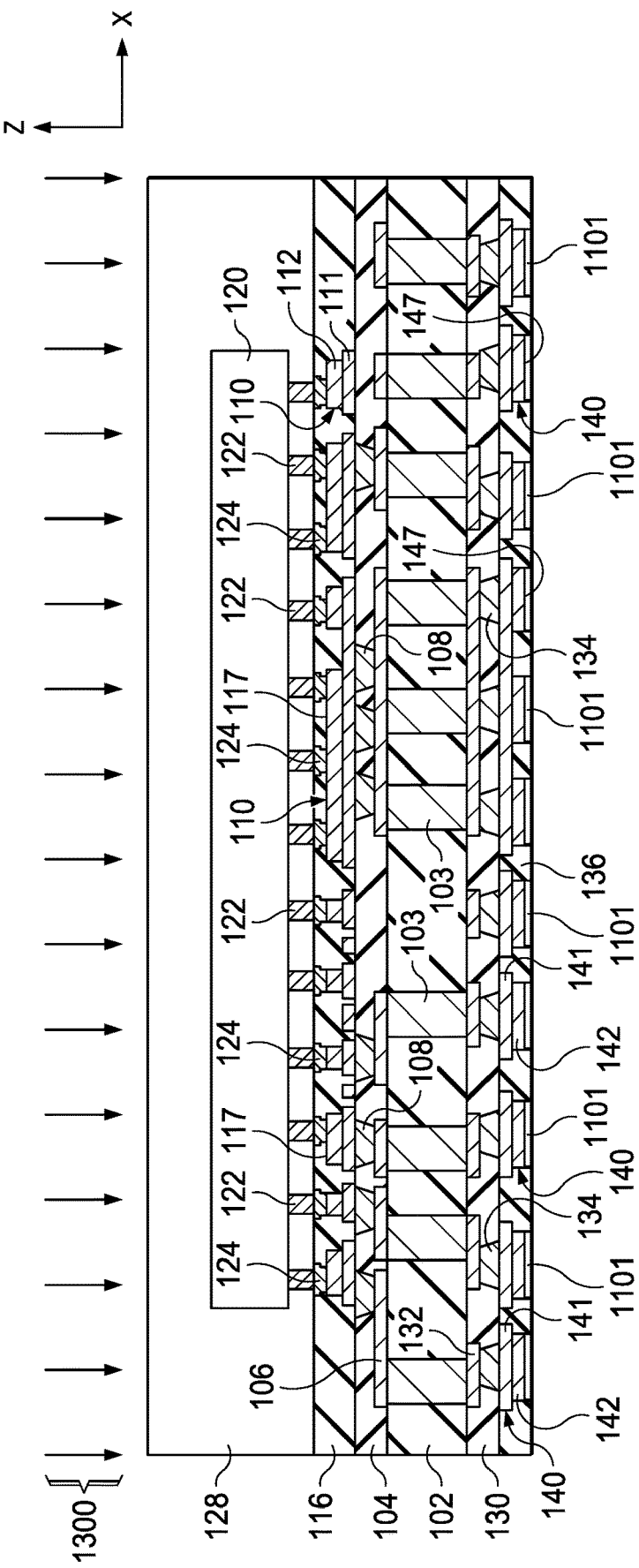
Figure 14:
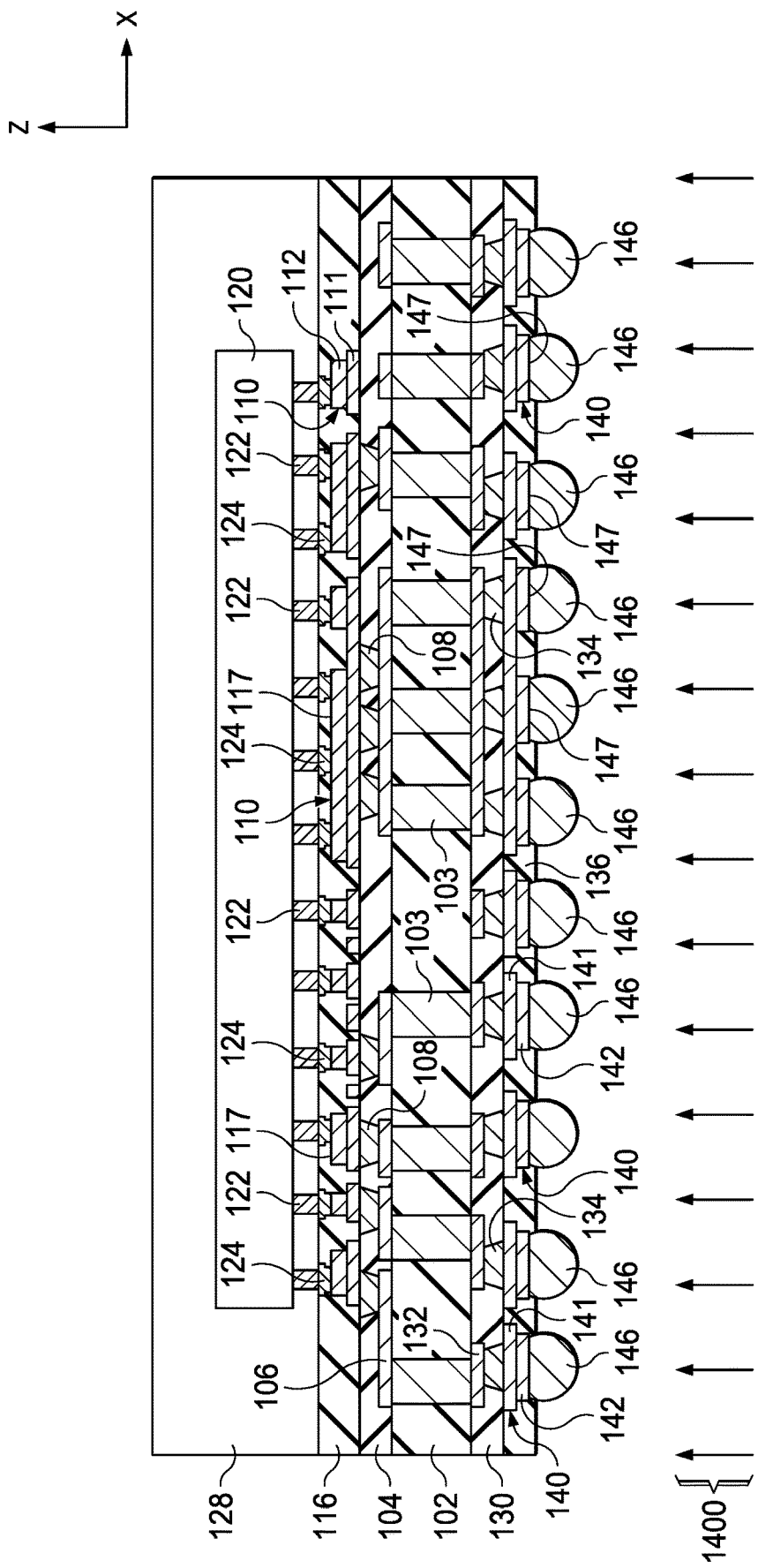

The method 200 continues at 214 in FIG. 2 with package molding. FIG. 13 shows one example, in which a molding process 1300 is performed that encloses a portion of the multilevel package substrate 101 and the die 120 in the package structure 128. In one example, the lower solder mask 136 is optionally formed at 215 after package molding. At 216 in FIG. 2, the method 200 also includes attaching the solder balls 146 to the bottom sides of the fourth conductive trace features 140. FIG. 14 shows one example, in which a ball attach process 1400 is performed that attaches the solder balls 146 to the conductive landing pad second sides 147 of the second portions 142 of the fourth conductive trace features 140.

A package separation process (not shown) is then performed at 217 in FIG. 2, such as sawing, laser cutting, etc. FIGS. 1-1D above show the example finished electronic device 100. In another example, the solder mask formation at 212 or 215 and the ball attach process at 216 are omitted, and the exposed bottom sides of the conductive landing pad second sides 147 of the second portions 142 of the fourth conductive trace features 140 can be soldered to a host PCB (not shown), for example, using solder paste, or the electronic device 100 can be installed in a socket of a host PCB, or connected by other suitable attachment techniques, for example, in a land grid array (LGA) application. In another implementation, solder pads (not shown) are attached to the conductive landing pad second sides 147 on the multilevel package substrate 101 instead of attaching solder balls, to facilitate later soldering to a host PCB or attachment to a socket (not shown) of a host PCB.

Figure 15:
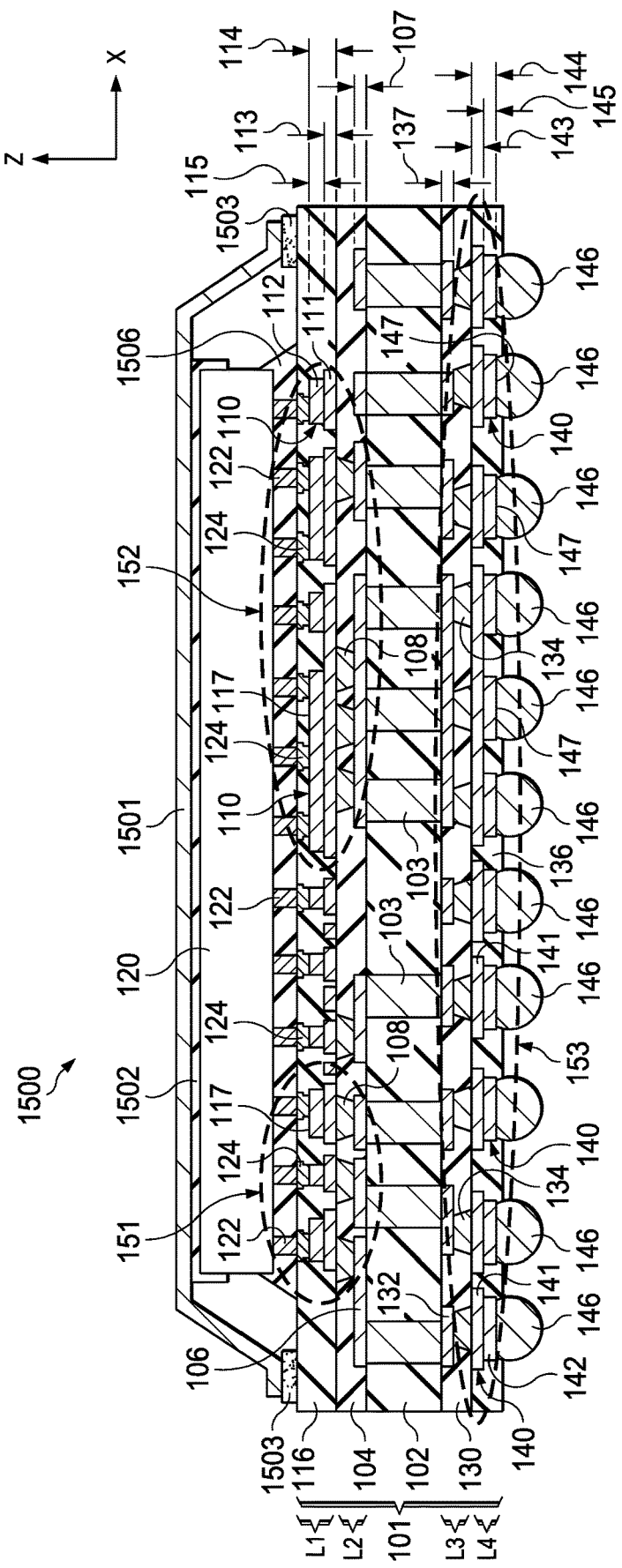
FIG. 15 shows a partial sectional side elevation view of another flip chip ball grid array packaged electronic device with stair shaped substrate traces and a conductive lid.

FIG. 15 shows another flip chip ball grid array packaged electronic device 1500 having structures as described above with stair shaped substrate traces conductive trace features 110 and 140. The electronic device 1500 in this example includes a conductive lid 1501 with a bottom side attached to the top side of the die 120 using an adhesive thermal interface material 1502 (TIM) and legs attached to outer portions of the top side of the multilevel package substrate 101 using adhesive thermal interface material 1503. The packaged electronic device 1500 in one example includes underfill material 1506 that fills the space between the die 120 and the multilevel package substrate 101 around the conductive terminals 122.

Figure 16:
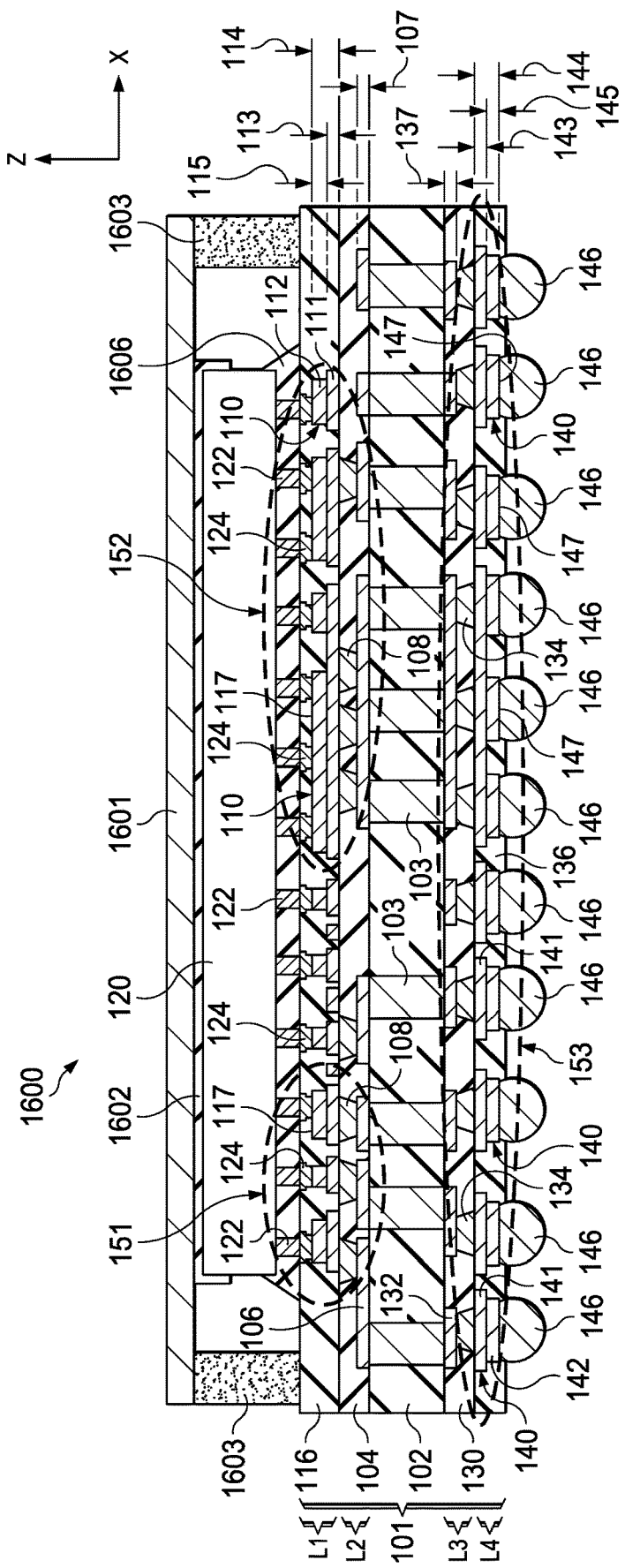
FIG. 16 shows a partial sectional side elevation view of another flip chip ball grid array packaged electronic device with stair shaped substrate traces and a flat conductive lid.

FIG. 16 shows another flip chip ball grid array packaged electronic device 1600 having structures as described above with stair shaped substrate traces conductive trace features 110 and 140. The electronic device 1600 in this example includes a flat conductive lid 1601 with a bottom side attached to the top side of the die 120 using an adhesive thermal interface material 1602 (TIM) and attached to outer portions of the top side of the multilevel package substrate 101 using spacers 1603. The packaged electronic device 1600 in one example includes underfill material 1606 that fills the space between the die 120 and the multilevel package substrate 101 around the conductive terminals 122.

The described examples provide a solution to substrate trace cracking that can be tailorable to areas of high stress regions (e.g., die shadow regions 151 and 152 on the top side and/or the second region 153 on the bottom side), where stair shaped conductive trace features can be designed at specific or isolated areas where enhanced substrate trace integrity strength is helpful. Example implementations provide robust substrate traces to accommodate device operation at high temperatures (e.g., 125° C.) and operation across wide thermal ranges (e.g., −40° C. to 125° C.) for reduction in stress (e.g., 25% reduction in stress) dependent on the stress direction as compared to thinner trace features. The described examples provide advantages over alternative solutions including implementation in packaged electronic device manufacturing using existing substrate processing equipment and processes. The described solutions facilitate localized CTE matching improvement with the multilevel package substrate 101, for example, by displacing higher CTE ABF dielectric with lower CTE copper to reduce stress during temperature cycling of the packaged electronic device 100. The strategic placement of the taller trace layers specific to high stress areas within the same level or levels provides higher reliability margin by extending crack propagation due to increase in Z direction height and improved localized CTE matching to lower package stress without the added cost of using new lower CTE substrate materials.

Modifications are possible in the described examples, and other implementations are possible, within the scope of the claims.

What is claimed is:

1. An electronic device, comprising:
   a multilevel package substrate having a first level and a second level, the first level extending in a first plane of orthogonal first and second directions, the second level extending in a second plane of the first and second directions, the second level including a first trace layer with a first conductive trace feature, a conductive first via that contacts the first conductive trace feature, and a first dielectric layer, the first level on the second level and including a second trace layer with a second conductive trace feature, the second conductive trace feature having a first portion and a second portion, the first portion having a first thickness along a third direction, the third direction orthogonal to the first and second directions, the second portion having a side and a second thickness along the third direction, wherein the side of the second portion faces away from the first plane, and the second thickness is greater than the first thickness; and
   a die having a conductive terminal electrically coupled to the side of the second portion, wherein the second portion of the second conductive trace feature locates within selective areas of the first level and the selective areas are along a periphery of the die.

2. The electronic device of claim 1, wherein:
   the multilevel package substrate includes a core dielectric layer, a third level, and a fourth level;
   the core dielectric layer has opposite first and second sides;
   the second level on the first side of the core dielectric layer;
   the third level on the second side of the core dielectric layer and extending in a third plane of the first and second directions, the third level including a third trace layer with a third conductive trace feature, a conductive second via that contacts the third conductive trace feature, and a third second dielectric layer;
   the fourth level on the third level and extending in a fourth plane of the first and second directions, the fourth level including a fourth trace layer with a fourth conductive trace feature having a second side that faces away from the fourth plane; and
   a solder ball attached to the second side of the fourth conductive trace feature.

3. The electronic device of claim 2, wherein the fourth conductive trace feature has a first portion and a second portion, the first portion of the fourth conductive trace feature having a third thickness along the third direction, the second portion of the fourth conductive trace feature having the second side of the fourth conductive trace feature, the second portion of the fourth conductive trace feature having a fourth thickness along the third direction, and the fourth thickness greater than the third thickness.

4. The electronic device of claim 3, wherein:
   the first thickness is 10 to 20 µm;
   the second thickness is 5 to 15 µm greater than the first thickness;
   the third thickness is 10 to 20 µm; and
   the fourth thickness is 5 to 15 µm greater than the third thickness.

5. The electronic device of claim 3, wherein:
   the selective areas of the first level comprise a first region of the first level proximate a lateral side of the die; and
   the fourth conductive trace feature is positioned in a second region of the fourth level.

6. The electronic device of claim 5, wherein the first region of the first level is under the die.

7. The electronic device of claim 3, wherein:
   the first level includes multiple second conductive trace features, each having respective first and second portions, the respective first portions having the first thickness along the third direction, and the respective second portions having the second thickness along the third direction; and
   the fourth level includes multiple fourth conductive trace features, each having respective first and second portions, the respective first portions of the fourth conductive trace features having the third thickness along the third direction, and the respective second portions of the fourth conductive trace features having the fourth thickness along the third direction.

8. The electronic device of claim 1, wherein:
   the first thickness is 10 to 20 µm; and
   the second thickness is 5 to 15 µm greater than the first thickness.

9. The electronic device of claim 1, wherein the selective areas of the first level comprise a first region of the first level proximate a lateral side of the die.

10. The electronic device of claim 1, wherein the first level includes multiple second conductive trace features, each having respective first and second portions, the respective first portions having the first thickness along the third direction, and the respective second portions having the second thickness along the third direction.

11. A multilevel package substrate, comprising:
    a first level that extends in a first plane of orthogonal first and second directions; and
    a second level that extends in a second plane of the first and second directions;
    the second level including a first trace layer with a first conductive trace feature, a conductive first via that contacts the first conductive trace feature, and a first dielectric layer; and
    the first level on the second level and including a second trace layer with a second conductive trace feature, the second conductive trace feature having a first portion and a second portion, the first portion having a first thickness along a third direction, the third direction orthogonal to the first and second directions, the second portion having a side and a second thickness along the third direction, wherein the side of the second portion faces away from the first plane, and the second thickness is greater than the first thickness, and wherein the second portion of the second conductive trace feature locates within selective areas of the first level and the selective areas are along a periphery of a die attached to the multilevel package substrate.

12. The multilevel package substrate of claim 11, further comprising a core dielectric layer, a third level, and a fourth level; wherein:
the core dielectric layer has opposite first and second sides;
the second level on the first side of the core dielectric layer;
the third level on the second side of the core dielectric layer and extending in a third plane of the first and second directions, the third level including a third trace layer with a third conductive trace feature, a conductive second via that contacts the third conductive trace feature, and a second dielectric layer;
the fourth level on the third level and extending in a fourth plane of the first and second directions, the fourth level including a fourth trace layer with a fourth conductive trace feature having a second side that faces away from the fourth plane; and
a solder ball attached to the second side of the fourth conductive trace feature.

13. The multilevel package substrate of claim 12, wherein the fourth conductive trace feature has a first portion and a second portion, the first portion of the fourth conductive trace feature having a third thickness along the third direction, the second portion of the fourth conductive trace feature having the second side of the fourth conductive trace feature, the second portion of the fourth conductive trace feature having a fourth thickness along the third direction, and the fourth thickness greater than the third thickness.

14. The multilevel package substrate of claim 13, wherein:
the first thickness is 10 to 20 µm;
the second thickness is 5 to 15 µm greater than the first thickness;
the third thickness is 10 to 20 µm; and
the fourth thickness is 5 to 15 µm greater than the third thickness.

15. The multilevel package substrate of claim 13, wherein:
the selective areas of the first level comprise a first region of the first level proximate a lateral side of the die; and
the fourth conductive trace feature is positioned in a second region of the fourth level.

16. The multilevel package substrate of claim 11, wherein:
the first thickness is 10 to 20 µm; and
the second thickness is 5 to 15 µm greater than the first thickness.

17. A method, comprising:
forming a second level on a side of a core dielectric layer in a second plane of orthogonal first and second directions, the second level including a first trace layer with a first conductive trace feature, a conductive first via that contacts the first conductive trace feature, and a first dielectric layer; and
forming a first level that extends on the second level in a first plane of the first and second directions, the first level including a second trace layer with a second conductive trace feature, the second conductive trace feature having a first portion and a second portion, the first portion having a first thickness along a third direction, the third direction orthogonal to the first and second directions, the second portion having a side and a second thickness along the third direction, the side of the second portion facing away from the first plane, and the second thickness greater than the first thickness, wherein the second portion of the second conductive trace feature locates within selective areas of the first level and the selective areas are along a periphery of a die attached to the first level.

18. The method of claim 17, further comprising:
forming a third level on a second side of the core dielectric layer in a third plane of the first and second directions, the third level including a third trace layer with a third conductive trace feature, a conductive second via that contacts the third conductive trace feature, and a third second dielectric layer; and
forming a fourth level on the third level and extending in a fourth plane of the first and second directions, the fourth level including a fourth trace layer with a fourth conductive trace feature having a first portion and a second portion, the first portion of the fourth conductive trace feature having a third thickness along the third direction, the second portion of the fourth conductive trace feature having a second side that faces away from the fourth plane, the second portion of the fourth conductive trace feature having a fourth thickness along the third direction, and the fourth thickness greater than the third thickness.

19. The method of claim 18, further comprising:
performing an electrical connection process that electrically couples a conductive terminal of the die to the side of the second portion of the second conductive trace feature; and
attaching a solder ball to the second side of the second portion of the fourth conductive trace feature.

20. The method of claim 17, wherein forming the first level includes:
forming a first mask on the second level, the first mask exposing a first portion of the second level;
forming the first portion of the second conductive trace feature on the exposed first portion of the second level using the first mask;
removing the first mask;
forming a second mask on the second level and part of the first portion of the second conductive trace feature, the second mask exposing a second part of the first portion of the second conductive trace feature; and
forming the second portion of the second conductive trace feature on the exposed second part of the first portion of the second conductive trace feature using the second mask.

* * * * *